United States Patent
Zhang et al.

(10) Patent No.: US 10,920,756 B2
(45) Date of Patent: Feb. 16, 2021

(54) COUPLED ACCORDION SPRINGS IN MICROELECTROMECHANICAL SYSTEMS (MEMS) DEVICES

(71) Applicant: Analog Devices, Inc., Norwood, MA (US)

(72) Inventors: Qian Zhang, Methuen, MA (US); Kuang L. Yang, Newton, MA (US); Lei Gu, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 335 days.

(21) Appl. No.: 15/277,511

(22) Filed: Sep. 27, 2016

(65) Prior Publication Data
US 2018/0087491 A1 Mar. 29, 2018

(51) Int. Cl.
| | |
|---|---|
| *H02K 11/00* | (2016.01) |
| *F03G 7/08* | (2006.01) |
| *G01P 15/125* | (2006.01) |
| *B81B 3/00* | (2006.01) |
| *G01P 15/18* | (2013.01) |
| *G01P 15/08* | (2006.01) |

(52) U.S. Cl.
CPC .............. *F03G 7/08* (2013.01); *B81B 3/0037* (2013.01); *G01P 15/125* (2013.01); *B81B 2203/0163* (2013.01); *G01P 15/18* (2013.01); *G01P 2015/084* (2013.01)

(58) Field of Classification Search
CPC . F03G 7/08; B81B 3/00; G01P 15/125; G01P 15/18; G01P 2015/084
USPC ........................................................ 310/300
See application file for complete search history.

(56) References Cited

U.S. PATENT DOCUMENTS

| | | | |
|---|---|---|---|
| 6,860,151 B2 | 3/2005 | Platt et al. | |
| 9,246,017 B2 | 1/2016 | Van Der Heide et al. | |
| 9,372,084 B2* | 6/2016 | Furuhata | ............ G01C 19/5747 |
| 2009/0256297 A1* | 10/2009 | Geisberger | ............ G01P 15/125 |
| | | | 267/160 |

(Continued)

FOREIGN PATENT DOCUMENTS

| | | |
|---|---|---|
| CN | 101382564 A | 3/2009 |
| CN | 101844739 A | 9/2010 |

(Continued)

OTHER PUBLICATIONS

Fedder, Simulation of Microelectromechanical Systems. Faculty of Electrical Engineering and Computer Sciences. University of California, Berkeley, CA. Dissertation. 1994. 319 pages.

(Continued)

*Primary Examiner* — Jianchun Qin
(74) *Attorney, Agent, or Firm* — Wolf, Greenfield & Sacks, P.C.

(57) ABSTRACT

Microelectromechanical systems (MEMS) devices are described that include a proof mass movably connected to a substrate by accordion springs disposed on opposite sides of the proof mass, with a coupler coupling two of the accordion springs together. The coupler is a bar in some implementations, and may be rigid. The coupler therefore restricts the motion of the accordion springs relative to each other. In this manner, the motion of the proof mass may be restricted to preferred types and frequencies.

20 Claims, 10 Drawing Sheets

(56) References Cited

U.S. PATENT DOCUMENTS

| | | | |
|---|---|---|---|
| 2010/0122577 A1* | 5/2010 | Neul | G01C 19/5726 |
| | | | 73/504.12 |
| 2011/0062820 A1* | 3/2011 | Aoyagi | H02N 1/08 |
| | | | 310/300 |
| 2012/0297876 A1 | 11/2012 | Gauger et al. | |
| 2014/0083210 A1 | 3/2014 | Andersson et al. | |
| 2014/0245832 A1 | 9/2014 | Lin et al. | |
| 2015/0013455 A1* | 1/2015 | Deimerly | G01P 15/123 |
| | | | 73/511 |
| 2016/0131679 A1 | 5/2016 | Hsu et al. | |

FOREIGN PATENT DOCUMENTS

| | | |
|---|---|---|
| CN | 201780110 U | 3/2011 |
| CN | 104955767 A | 9/2015 |
| JP | 2006-147995 A | 6/2006 |

OTHER PUBLICATIONS

Legtenberg et al., Comb-drive actuators for large displacements. J Micromech Microeng. 1996;6:320-9.

\* cited by examiner

COUPLED ACCORDION SPRINGS IN MICROELECTROMECHANICAL SYSTEMS (MEMS) DEVICES

FIELD OF THE DISCLOSURE

The present disclosure relates to springs coupling a proof mass to a substrate in microelectromechanical systems (MEMS) devices.

BACKGROUND

Various microelectromechanical systems (MEMS) devices include a proof mass movably coupled to a substrate. Such devices employ a range of coupling structures coupling the proof mass to the substrate, such as straight beam couplers, T-anchors, spiral springs, or folded springs.

SUMMARY OF THE DISCLOSURE

Microelectromechanical systems (MEMS) devices are described that include a proof mass movably connected to a substrate by accordion springs disposed on opposite sides of the proof mass, with a coupler coupling two of the accordion springs together. The coupler is a bar in some implementations, and may be rigid. The coupler therefore restricts the motion of the accordion springs relative to each other. In this manner, the motion of the proof mass may be restricted to preferred types and frequencies.

In certain embodiments, a microelectromechanical systems (MEMS) device is provided, comprising a substrate, a proof mass movably coupled to the substrate by first and second accordion springs, wherein the proof mass is disposed between the first and second accordion springs along a direction of compression of the first accordion spring and/or the second accordion spring, and a bar coupling the first accordion spring with the second accordion spring.

In certain embodiments, a microelectromechanical systems (MEMS) device is provided, comprising a substrate, a proof mass movably coupled to the substrate by first and second accordion springs, wherein the proof mass is disposed between the first and second accordion springs along a direction of compression of the first accordion spring and/or the second accordion spring, and means for coupling the first accordion spring with the second accordion spring.

In certain embodiments, a system is provided that is configured to harvest energy. The system comprises an energy storage device, and an energy harvester coupled to the energy storage device and configured to deliver power to the energy storage device. The energy harvester comprises a substrate, a proof mass movably coupled to the substrate by first and second accordion springs, wherein the proof mass is disposed between the first and second accordion springs along a direction of compression of the first accordion spring and/or the second accordion spring, and a bar coupling the first accordion spring with the second accordion spring.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Aspects of the present application provide a microelectromechanical systems (MEMS) device having a movable proof mass coupled to a substrate by two accordion springs on opposite sides of the proof mass which are coupled together by a coupler. The two springs may be accordion springs, having a serpentine shape, extending along a direction of motion of the proof mass, and the coupler may be a bar extending along the direction of motion from one of the springs to the other. The bar may be rigid, thus restraining motion of the two springs relative to each other. In this manner, undesirable modes of vibration of the accordion springs may be inhibited during normal operating conditions of the MEMS device.

In some embodiments, the springs may include multiple folds. Multiple couplers may couple one spring to the other, for instance by coupling respective folds of one spring to the other. The couplers may all be rigid bars in some embodiments.

In some embodiments, the MEMS device is an energy harvesting device which harvests energy from the motion of the movable proof mass. It is desirable in at least some embodiments that the displacement of the proof mass from its equilibrium position is large, for example being greater than 200 microns. The larger the displacement, the greater the amount of energy which may be harvested. The couplers described herein as coupling together two accordion springs may facilitate the use of such springs in a MEMS device in which the proof mass is intended to undergo large displacements. The couplers may allow for large displacements in a preferred mode of vibration of the MEMS device, while inhibiting displacement associated with unwanted spurious modes of vibration.

Figure 1A:
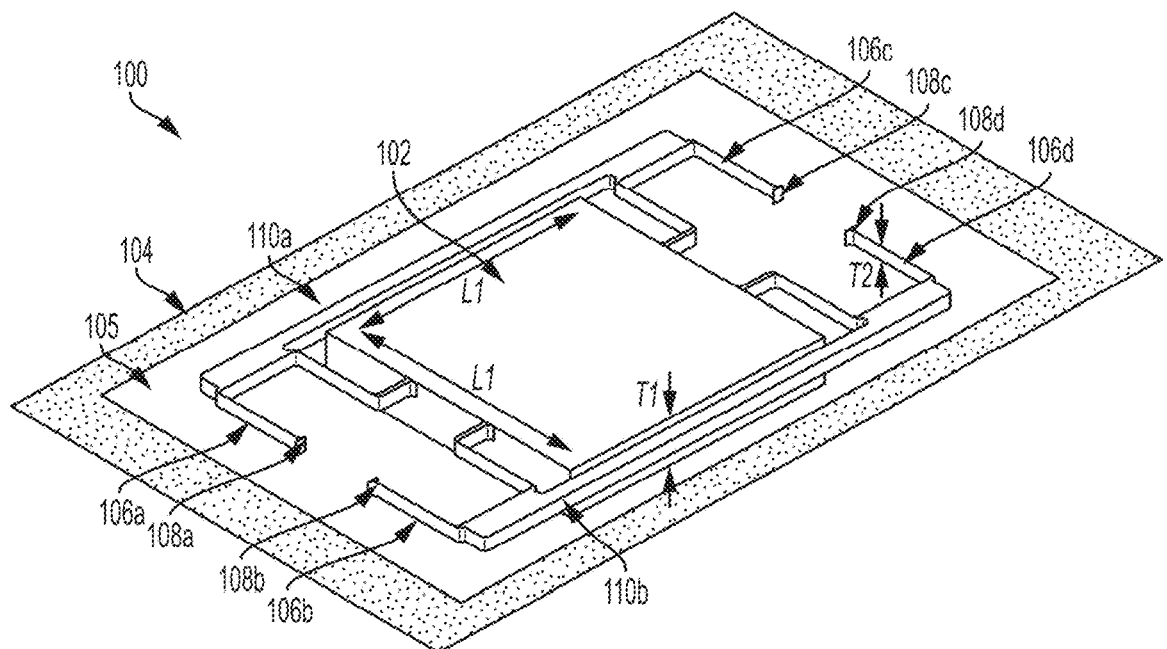
FIG. 1A is a perspective view of a microelectromechanical systems (MEMS) inertial device having a proof mass springedly connected to a substrate by accordion springs, with a bar coupling two of the accordion springs together, according to an embodiment of the present application.
Figure 1B:
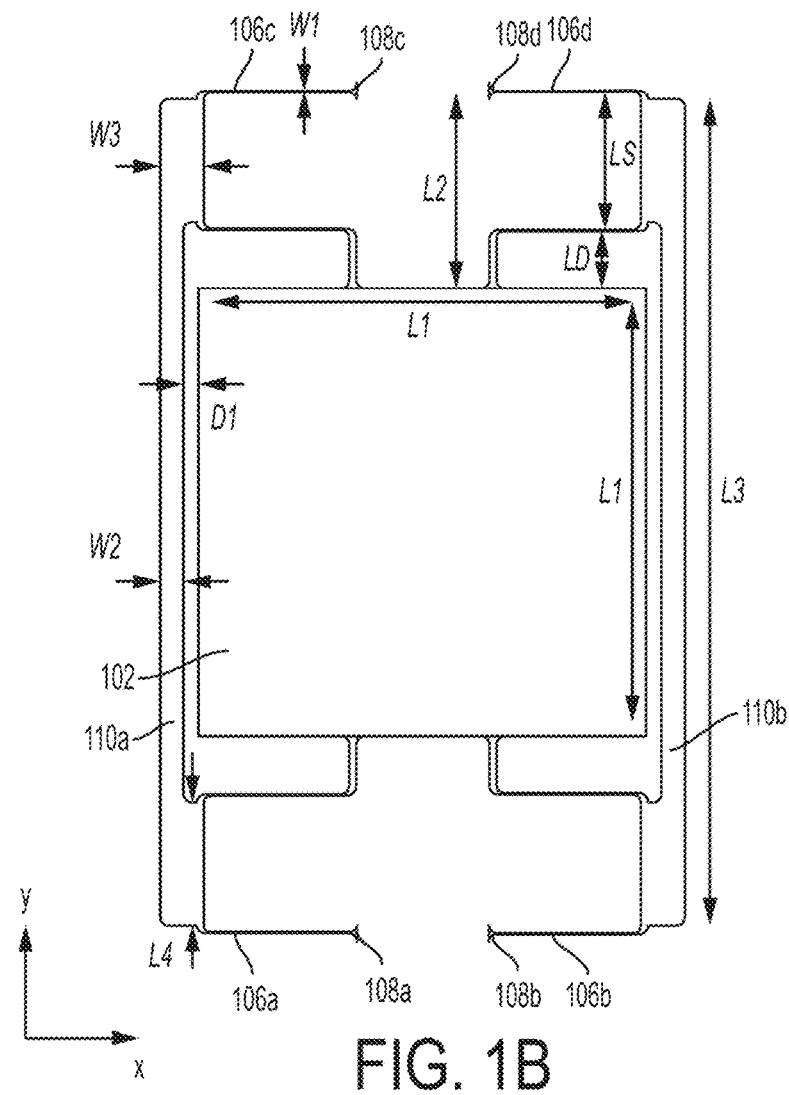
FIG. 1B is a top view of the MEMS inertial device of FIG. 1A.

FIG. 1A is a perspective view of a MEMS device having a proof mass springedly connected to a substrate by accordion springs, with a bar coupling two of the accordion springs together, according to an embodiment of the present application. The MEMS device 100 includes a proof mass 102, a substrate 104 with a cavity 105, four accordion springs 106a, 106b, 106c, and 106d with respective anchor points 108a, 108b, 108c, and 108d, and two couplers 110a and 110b. FIG. 1B is a top-down view of the structure of FIG. 1A, with the substrate 104 omitted for ease of illustration.

The proof mass 102 may have any suitable size and shape, and may be formed of any suitable material. As an example, the proof mass 102 may be rectangular (e.g., square), and may be formed of silicon. In some embodiments, the proof mass 102 is formed of the same material as the substrate 104. For example, the substrate 104 may be a silicon substrate, and the proof mass 102 may be formed from the substrate 104 by suitable micromachining techniques (e.g., lithography and etching). The proof mass 102 may have a thickness T1 between 0.3 mm and 3 mm, or any value or range of values within that range, as a non-limiting example. The proof mass 102 may have sides of length L1, between 3 mm and 20 mm, or any value or range of values within the range, as a non-limiting example.

The substrate 104 may be a silicon substrate, or alternatively may be formed of other semiconductor materials, as a non-limiting example. In some embodiments, the substrate 104 forms part of a wafer, such that multiple instances of the MEMS device 100 may be formed on the wafer simultaneously using wafer level fabrication techniques. In such embodiments, the individual MEMS devices may then be diced from the wafer. The cavity 105 may be formed in the substrate 104 using suitable micromachining techniques, such that the proof mass 102 is suspended above the cavity 105. It should be appreciated that alternative embodiments do not include a cavity in the substrate, as there are alternative manners of achieving a movable proof mass relative to the substrate 104.

The accordion springs 106a-106d, which may alternatively be referred to herein as "accordion tethers," "folded springs," "folded tethers" or by other similar terminology, are substantially identical to each other in this non-limiting example, and each includes a single fold. In alternative embodiments, an accordion spring may include more than one fold, with an example being illustrated in FIG. 2A and described further below. As can be seen in FIGS. 1A and 1B, a pair of accordion springs is included on opposite sides of the proof mass 102. A first pair comprising accordion springs 106a and 106b is on one side of the movable proof mass 102, and a second pair comprising accordion springs 106c and 106d is on the opposite side of the poof mass, such that the proof mass 102 is positioned between the pairs of accordion springs.

The accordion springs 106a-106d can expand and contract (or compress) along the y-axis (FIG. 2), allowing movement of the proof mass 102 in that direction. The springs 106a-106d are coupled to the substrate 104 at respective anchor points 108a-108d, which are fixed. The anchor points may correspond to the ends of the respective accordion springs 106a-106d. In one embodiment, the anchor points may represent pillars extending down to a surface of the substrate. Alternative configurations are possible. For example, the ends of the accordion springs represented by the anchor points 108a-108d may alternatively terminate on a side (or sidewall) of the substrate 104 in some embodiments.

The accordion springs 106a-106d may have any suitable dimensions. For example, referring to FIG. 1A, the accordion springs may have a thickness T2 between 10 microns and 2 mm, or any value or range of values within that range, as a non-limiting example. Referring to FIG. 1B, they may have a length L2 in the y-direction between 200 microns and 3 mm, or any value or range of values within that range, and the total meandering length will be longer. The length LS may determine the possible displacement of the proof mass, and thus may have a suitable value to provide a desired amount of displacement of the proof mass, for example being between 150 microns and 2 mm. The length LD of the segment providing the offset of the fold of the accordion springs from the proof mass may be approximately half the length LS. The widths W1 of the accordion springs 106a-106d, in the x-y plane, may vary along the length. For example, the width may be greater near the proof mass 102 and smaller near the anchor points. Alternative configurations are possible. The value of the widths W1 may be selected to provide a desired resonance frequency of the MEMS device. In some embodiments, the widths W1 may be between 1 microns and 300 microns, or any value or range of values within such ranges.

The dimensions of the accordion springs may be selected to allow for large displacements of the proof mass in the y-direction. For example, the lengths of the accordion springs and the positioning of the anchor points relative to the proof mass may be selected to allow for the accordion springs to expand and compress by between 0.3 mm and 5 mm, between 1 mm and 3 mm, or any value or range of values with such ranges. Thus, the range of motion of the proof mass 102 may be within those ranges, or larger distances in some embodiments. Such large displacements may be beneficial in various applications, such as when the MEMS device 100 is an energy harvester which harvests energy from the motion of the proof mass 102.

Figure 2A:
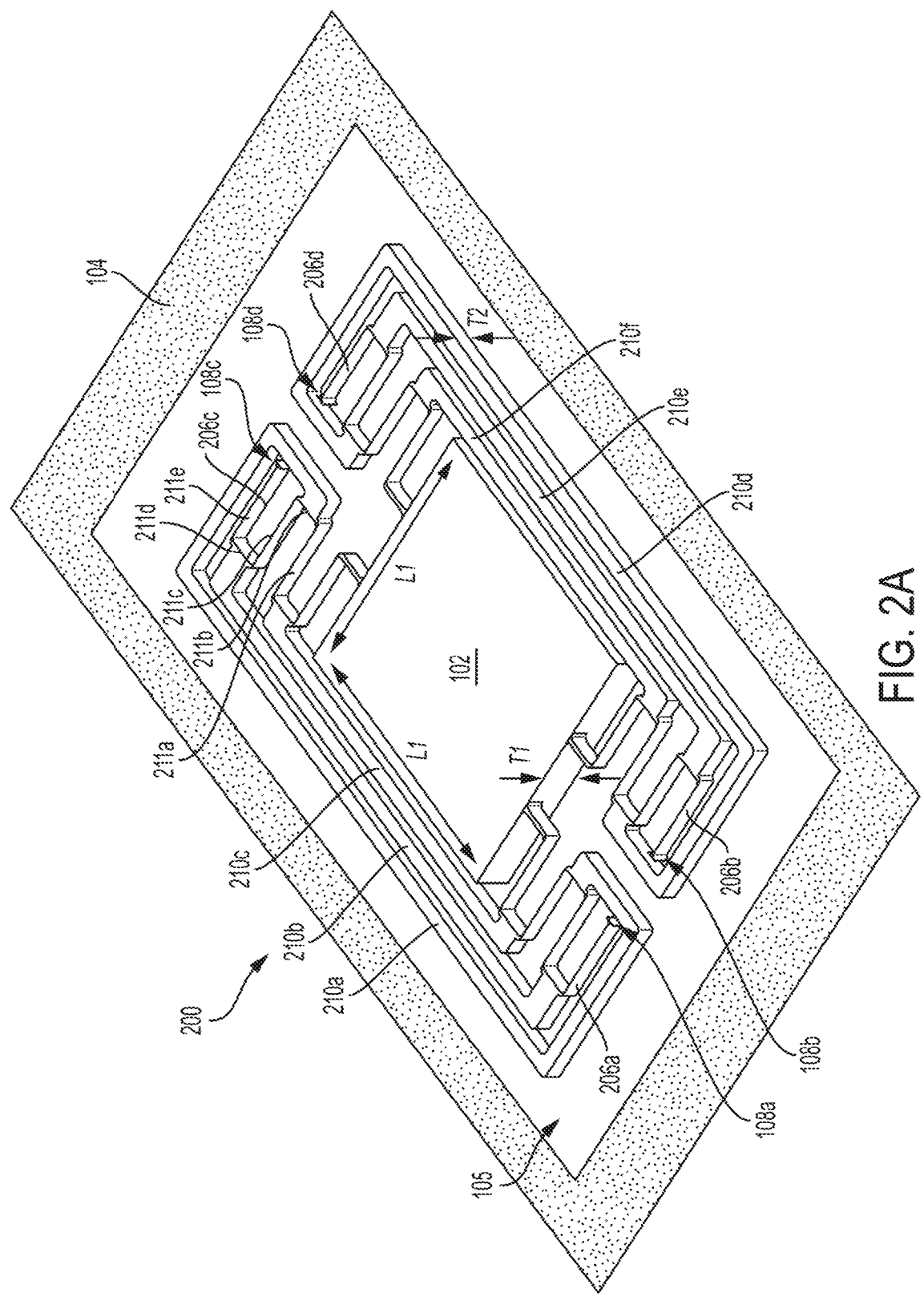
FIG. 2A is a perspective view of a MEMS inertial device having a proof mass springedly connected to a substrate by accordion springs, with multiple bars coupling multiple folds of two of the accordion springs together, according to an embodiment of the present application.
Figure 2B:
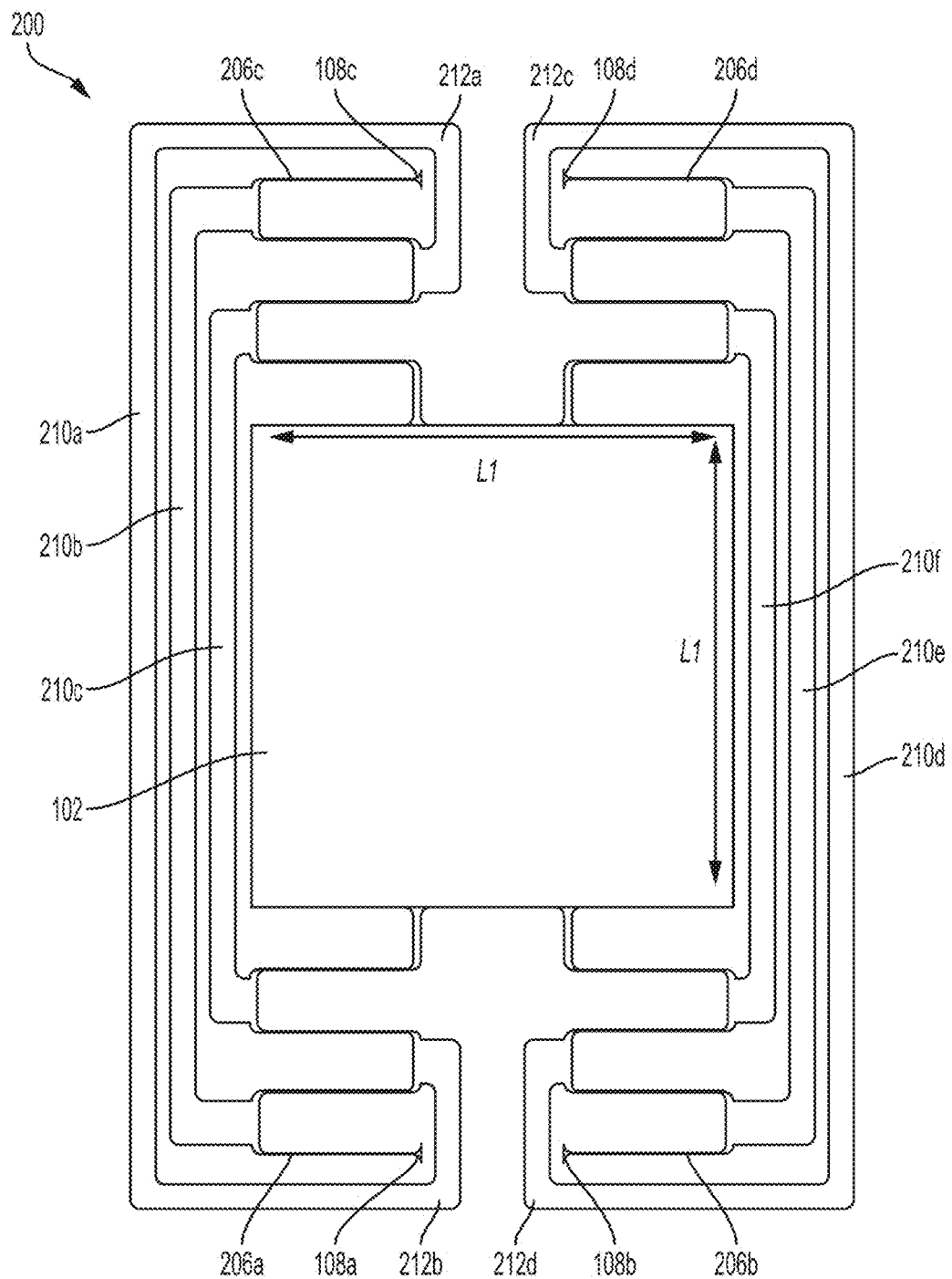
FIG. 2B is a top view of the MEMS inertial device of FIG. 2A.

MEMS devices may include accordion springs with different shapes than 106a-106d. That is, the shapes of accordion springs 106a-106d are non-limiting examples. A further example is illustrated in FIG. 2F and described further below.

As shown in FIGS. 1A-1D, the couplers 110a and 110b couple together accordion springs on opposite sides of the proof mass 102. In this example, coupler 110a couples together accordion springs 106a and 106c, while coupler 110b couples together accordion springs 106b and 106d. In this example, the couplers 110a and 110b are substantially straight bars. They may have any suitable dimensions to provide a desired degree of rigidity. For example, they may have the same thickness T2 as the accordion springs, but may have a width W2 greater than the width W1. In some embodiments, the width W2 is between two and 20 times greater than W1, between two and 10 times greater than W1, or any value or range of values within those ranges. The width W2 may be selected to be sufficient to substantially resist bending of the couplers 110a and 110b in the x or z directions, and to resist stretching or compressing in the y-direction under typical operating conditions of the MEMS device 100. For example, the width W2 may be between 50 and 500 microns, or any value or range of values in that range. The width W3 of the couplers 110a and 110b at the coupling points at which they couple to the accordion springs may be greater than the width W2. In some embodiments, the width W3 is between 1.5 and 5 times greater than W2, although alternatives are possible. The length L3 of the couplers 110a and 110b is sufficient to extend around the proof mass 102. For example, the length L3 may be between 1.25 and 3 times as long as the length L1 of the proof mass 102. At the coupling point of the couplers and the accordion spring, the length L4 may be sufficient provide a strong mechanical coupling between the spring and the coupler. In some embodiments, L4 is between 300 microns and 1.5 mm, although alternatives are possible.

It should be appreciated that in at least some embodiments the inclusion of the couplers 110a and 110b does not significantly add to the size of the MEMS device 100. As described above, the width of the couplers may be between 50 microns and 500 microns in some embodiments. The offset D1 of the couplers from the proof mass 102 in the x-direction may be between 20 microns and 300 microns, or any value in that range. Thus, in at least some embodiments the presence of the couplers 110a and 110b may add less than 30% of the length L1 to the device in the x-direction. In some embodiments, less than 20%, or less than 10% of the length L1 is added in the x-direction by including the couplers 110a and 110b. Thus, the benefits of the couplers may be achieved with a relatively small increase in device size.

As shown, in some embodiments couplers are provided which couple outward facing surfaces of the accordion springs. However, not all embodiments are limited in this respect, as couplers may be configured in alternative configurations to couple inward facing segments of the accordion springs. An example is shown in FIG. 2A and described further below.

The couplers 110a and 110b may be formed of any suitable material, and in some embodiments are formed of the same materials as the accordion springs which they couple. For example, they may be formed from the same patterning and etching processes.

Figure 1C:
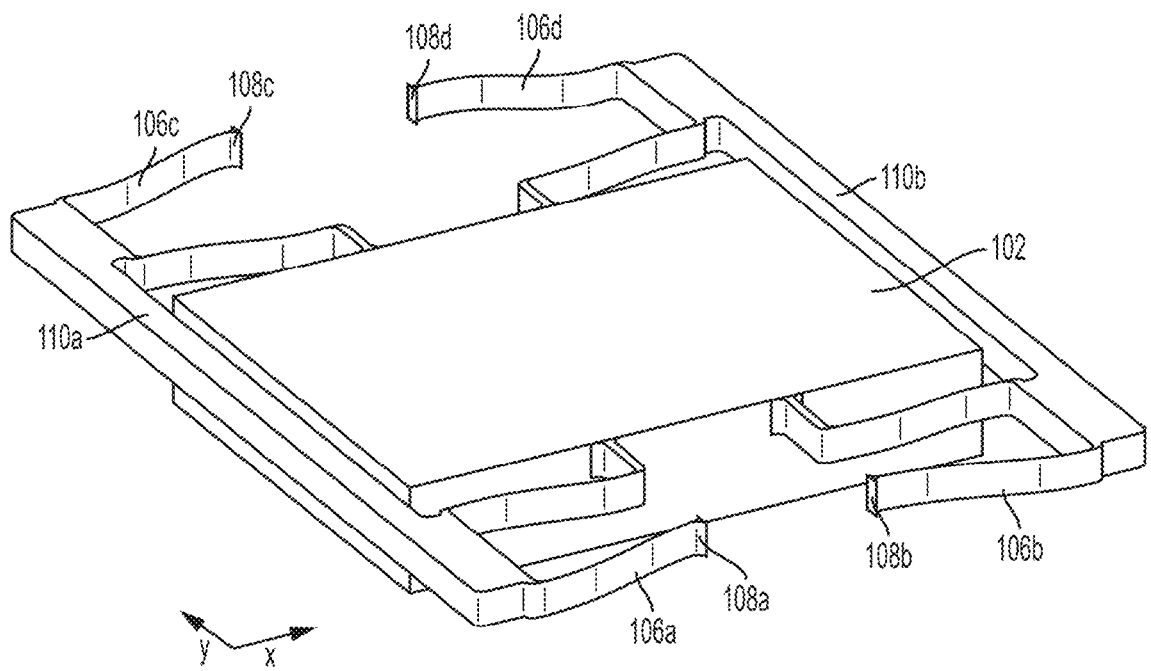
FIGS. 1C, 1D, and 1E illustrate three different modes of operation of the MEMS inertial device of FIGS. 1A-1B.
Figure 1D:
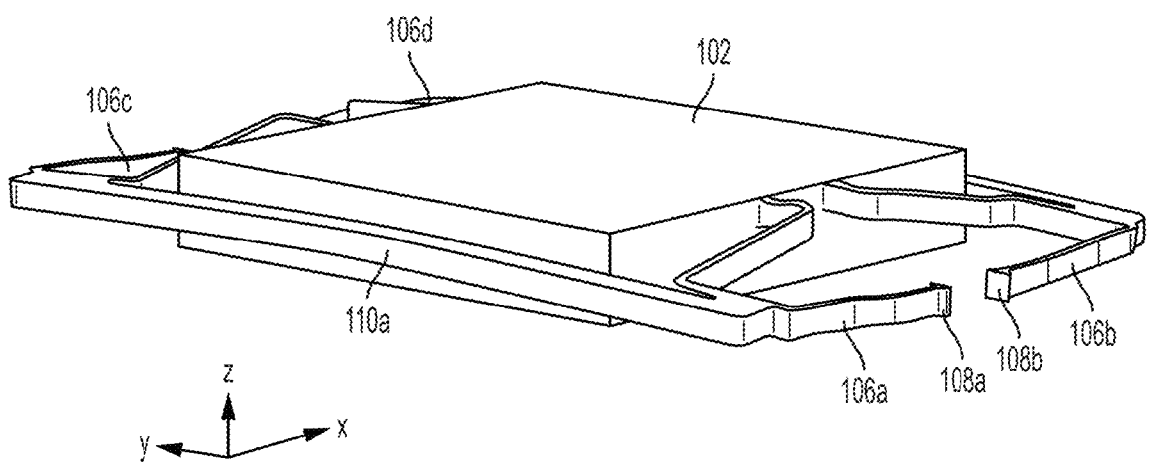
Figure 1E:
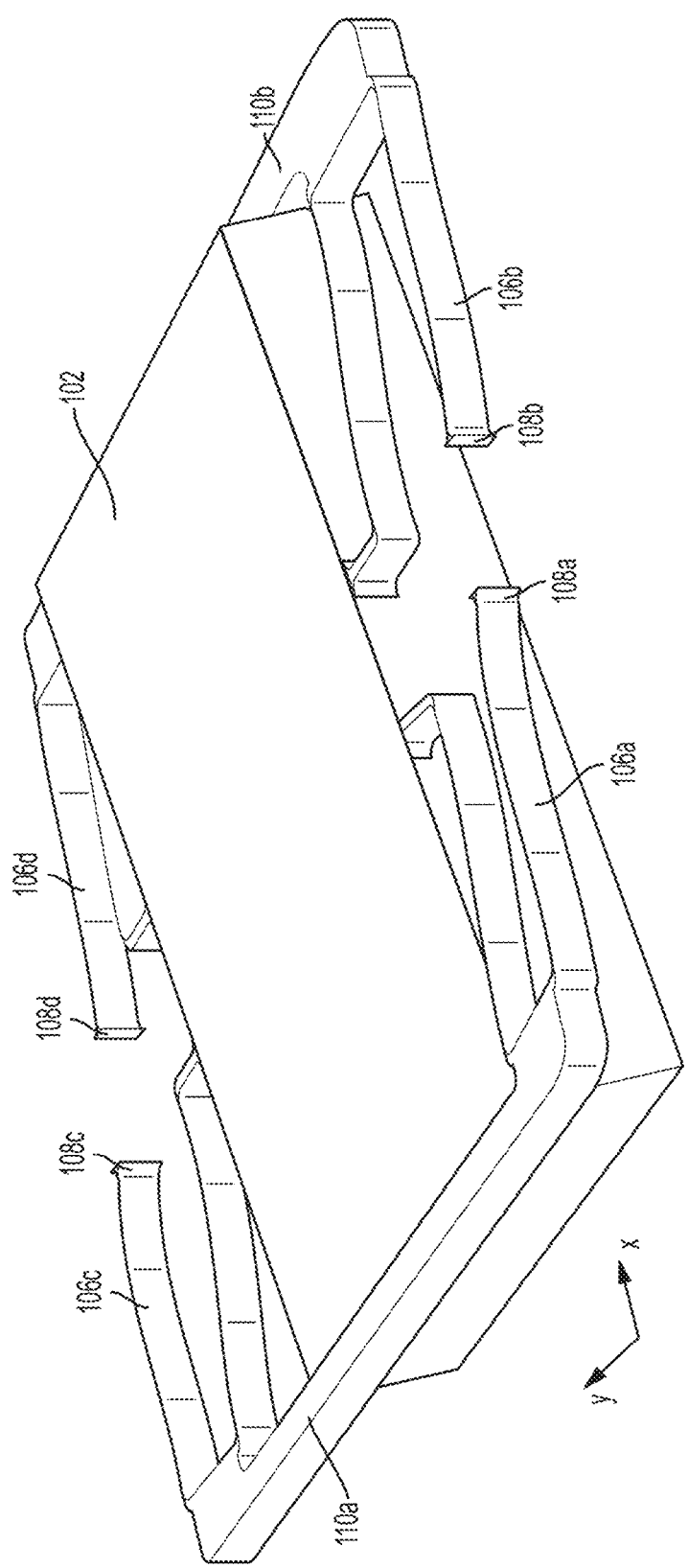

FIGS. 1C, 1D, and 1E illustrate three different modes of operation of the MEMS device 100 of FIGS. 1A-1B. These figures omit the substrate 104 for simplicity of illustration.

FIG. 1C illustrates the displacement of the MEMS device 100 associated with a fundamental mode of vibration of the mass spring system. In this example, the proof mass moves along the y-axis, and more particularly FIG. 1C illustrates a state in which the proof mass 102 is displaced from its equilibrium position in the negative y-direction. In this state, accordion springs 106a and 106b compress along the y-direction and accordion springs 106c and 106d expand along the y-direction. It can be seen that the couplers 110a and 110b do not expand or contract, such that the distance between the coupled folds of the accordion springs remains the same. That is, the distance between the coupling point of accordion spring 106a and the coupling point of accordion spring 106c remains unchanged from the equilibrium state of the MEMS device 100. Likewise, the distance between the coupling point of accordion spring 106b and the coupling point of accordion spring 106d remains unchanged from the equilibrium state.

In some embodiments, the motion illustrated in FIG. 1C represents the desired motion of the MEMS device 100. For example, it may be desired for the proof mass to undergo large displacements along the y-direction in response to experiencing vibration, acceleration, or some other condition of interest. In some embodiments, the displacement generates an electrical signal which is detected by suitable electrodes and captured and stored by suitable circuitry. Thus, the motion of the proof mass may be converted to electrical energy that is harvested. In alternative embodiments, the MEMS device 100 may be a sensor, such as an accelerometer or gyroscope, and the proof mass 102 may be displaced in response to a condition of interest, such as acceleration or rotation of the MEMS device 100. The displacement may be detected, thus providing an indication of the experienced condition. In other embodiments, the MEMS device may be an actuator. In some embodiments, a system may include more than one such MEMS device configured as different types of devices selected from among harvesters, sensors, and actuators.

FIG. 1D illustrates a mode of vibration in which the proof mass 102 is displaced along the z-axis. In particular, FIG. 1D illustrates a state in which the proof mass 102 is displaced from its equilibrium position in the positive z-direction. The couplers 110a and 110b may prevent the accordion springs 106a-106d from freely twisting in response to such motion of the proof mass, and thus may inhibit the mode of vibration shown.

FIG. 1E illustrates a mode of vibration in which the proof mass 102 rotates around the y-axis. In particular, FIG. 1E illustrates a state in which the proof mass 102 is rotated counterclockwise from its equilibrium position around the y-axis. The couplers 110a and 110b may prevent the accordion springs 106a-106d from freely twisting in response to such motion of the proof mass, and thus may inhibit the mode of vibration shown.

FIGS. 1D and 1E illustrate motion which may be undesirable in at least some embodiments, and thus the illustrated modes of vibration may be considered spurious modes. Again, in some embodiments it may be desirable for the proof mass 102 to exhibit the motion illustrated in FIG. 1C, along the y-axis. In such situations it may be beneficial to inhibit the occurrence of the motion shown in FIGS. 1D and 1E. The couplers 110a and 110b may result in the resonance frequencies of the modes of vibration shown in FIGS. 1D and 1E being sufficiently displaced in the frequency domain from the resonance frequency of the mode of vibration shown in FIG. 1C that they are unlikely to occur during typical operation of the MEMS device 100. Stated another way, the couplers 110a and 110b may inhibit or entirely prevent the types of displacement shown in FIGS. 1D and 1E by providing a rigid connection between the accordion springs. In some embodiments, the resonance frequencies associated with the modes of vibration illustrated in FIGS. 1D and 1E are significantly higher than the resonance frequency of the mode of vibration shown in FIG. 1C. For example, the modes of vibration of FIGS. 1D and 1E may have resonance frequencies that are between 200 Hz and 3 kHz greater than the resonance frequency of the mode of vibration of FIG. 1C, or any value or range of values within that range. In some embodiments, second and higher order modes of vibration of the mass-spring system may have resonance frequencies between 2 and 20 times greater than the resonance frequency of the first order mode of vibration.

As described previously, accordion springs coupling a proof mass to a substrate may include more than one fold. In such embodiments, one or more couplers of the types described herein may couple together one or more folds of two accordion springs. FIGS. 2A and 2B illustrate a non-limiting example.

MEMS device 200 includes many of the same components previously described in connection with FIGS. 1A and 1B, such that those components are not described in detail again here. It differs, however, in that multiple-fold accordion springs 206a, 206b, 206c, and 206d are provided to couple the proof mass 102 to the substrate 104. Also, MEMS device 200 includes six couplers 210a, 210b, 210c, 210d, 210e, and 210f.

In this example, each of the accordion springs 206a-206d has three folds, in contrast to the single fold accordion springs of FIG. 1A. The couplers 210a-210f couple together respective folds of opposing accordion springs. That is, couplers 210a-210c couple together respective folds of the accordion springs 206a and 206c, while couplers 210d-210f couple together respective folds of the accordion springs 206b and 206d. The couplers may have any suitable dimensions to provide a desired degree of rigidity. For example, the lengths, thicknesses, and widths of the couplers 210a-210f may be within the ranges previously listed with respect to couplers 110a and 110b, or any other suitable dimensions.

It can be seen from FIGS. 2A and 2B that couplers 210b, 210c, 210e, and 210f may be substantially the same shape as each other, but 210b and 210e may be of different lengths than 210c and 210f to allow for coupling of different folds of the coupled accordion springs. Couplers 210a and 210d have a different shape than the other couplers because they couple surfaces of the accordion springs which are facing each other. Stated another way, the couplers 210a and 210d have wrap-around segments which wrap around the accordion springs. For example, coupler 210a includes wrap around segments 212a and 212b, and coupler 210d includes wrap-around segments 212c and 212d. Thus, in some embodiments couplers are provided which couple folds of accordion springs which face in different directions from each other. For example, coupler 210b couples to a fold of accordion spring 206c made up of segments 211c, 211d, and 211e which faces a different direction than the fold of accordion spring 206c coupled by coupler 210a made up of segments 211a, 211b, and 211c.

It should be appreciated from FIGS. 2A and 2B that in some embodiments couplers are provided coupling each fold of opposing accordion springs. However, not all embodiments are limited in this respect. For example, an alternative construction of the MEMS device shown in FIGS. 2A and 2B may have two couplers or four couplers, rather than six. For example, couplers 210b and 210e may be omitted in an alternative embodiment.

Figure 2C:
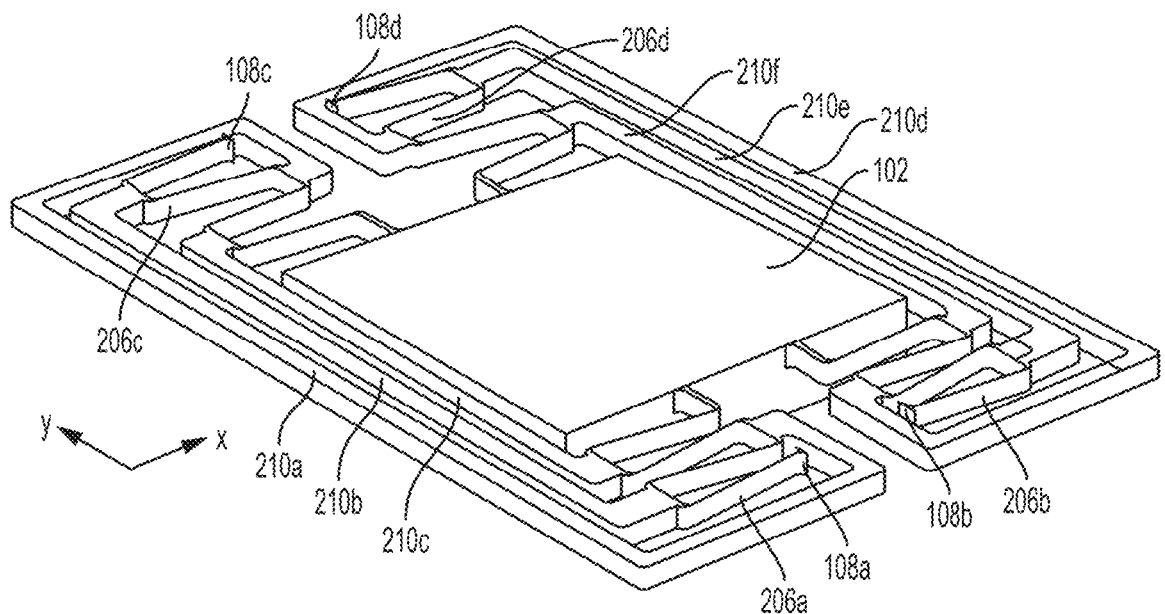
FIGS. 2C, 2D, and 2E illustrate three different modes of operation of the MEMS inertial device of FIGS. 2A-2B.
Figure 2D:
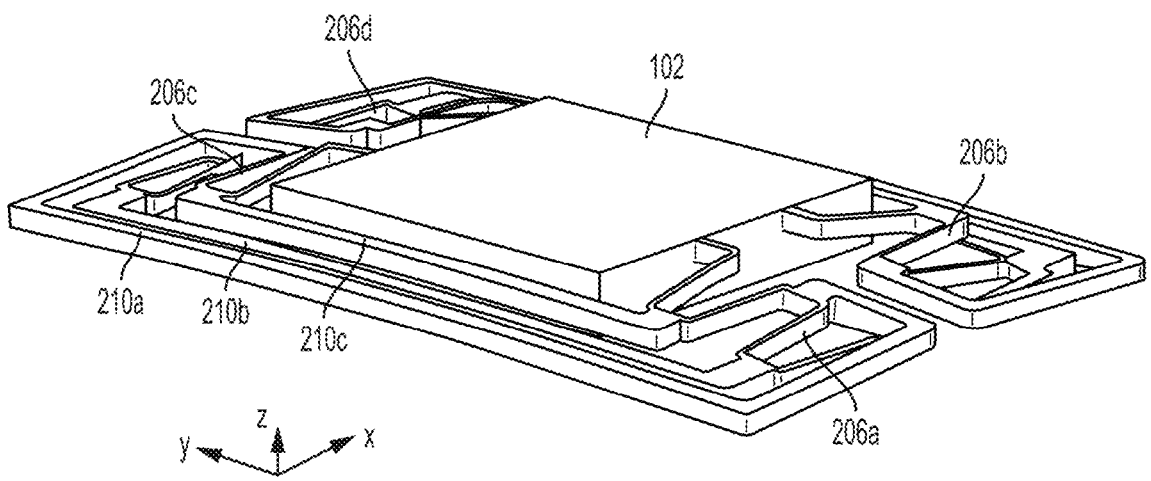
Figure 2E:
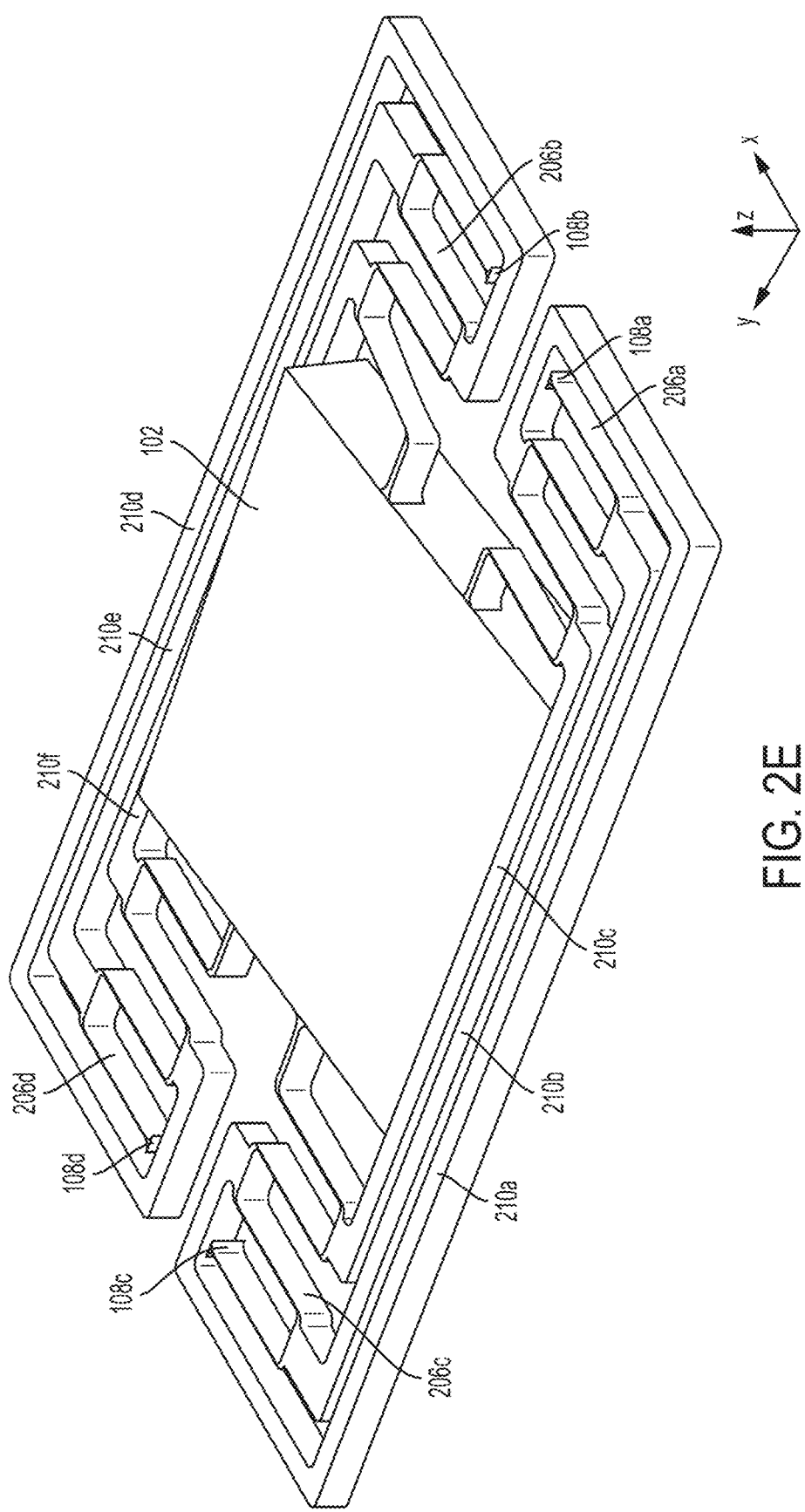
Figure 2F:
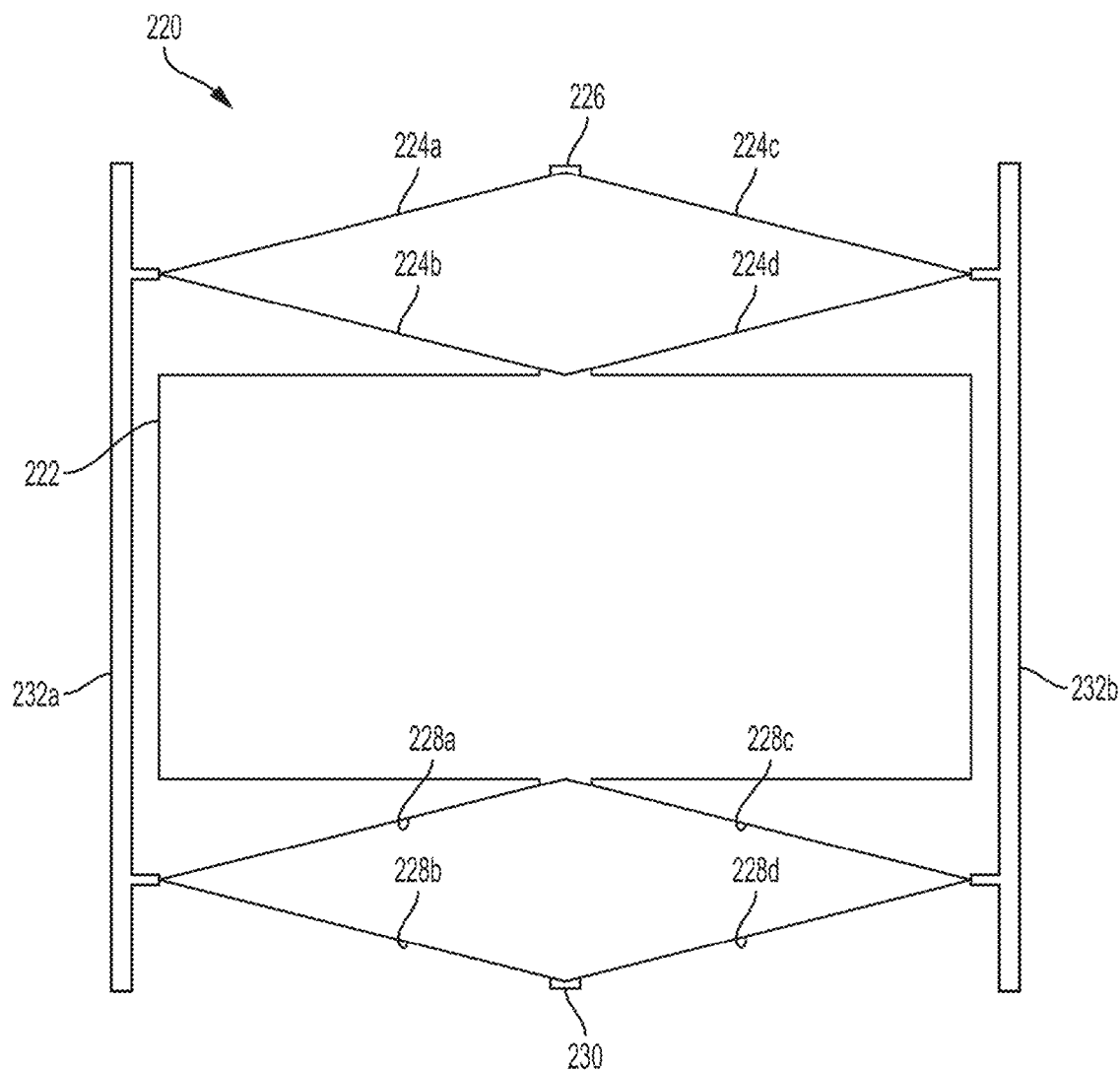
FIG. 2F is a top view of a MEMS device including an alternative shape for an accordion spring compared to that shown in FIG. 1A.

FIGS. 2C, 2D, and 2E illustrate three different modes of operation of the MEMS device of FIGS. 2A-2B. FIG. 2C illustrates a mode of vibration of the mass-spring system in which the proof mass moves in the y-direction. In particular, FIG. 2C illustrates a state in which the proof mass 102 is displaced from its equilibrium position in the negative y-direction. Accordion springs 206a and 206b compress and accordion springs 206c and 206d expand. The couplers 210a-210f do not expand or compress and therefore the distances between respective folds of the coupled springs do not change. In some embodiments, the mode of vibration represented in FIG. 2C represents a fundamental mode of vibration of the MEMS device 200.

FIG. 2D illustrates a mode of operation in which the proof mass 102 moves in the z-direction. In particular, FIG. 2D illustrates a state in which the proof mass 102 is displaced from its equilibrium position in the positive z-direction. Here, the couplers 210a-210f resist twisting of the accordion springs associated with such a mode of vibration, and thus inhibit the mode of vibration.

FIG. 2E illustrates a mode of vibration in which the proof mass 102 rotates around the y-axis. In particular, FIG. 2E illustrates a state in which the proof mass rotates counter-clockwise around the y-axis. The couplers 210a-210f also resist this mode of operation.

As with the couplers 110a and 110b of MEMS device 100, the couplers 210a-210f may impact the resonance frequencies of certain modes of vibration. For example, the resonance frequencies of the modes of vibration shown in FIGS. 2D and 2E may be substantially higher than the resonance frequency of the mode illustrated in FIG. 2C, making them less likely to occur during typical operation of the MEMS device 200. In this manner, the couplers 210a-210f may inhibit or prevent entirely such modes of vibration. As an example, the resonance frequencies associated with the modes of vibration of FIGS. 2D and 2E may be between 200 Hz and 3 kHz higher than the resonance frequency associated with the mode of vibration of FIG. 2C. In some embodiments, second and higher order modes of vibration of the mass-spring system may have resonance frequencies between 2 and 20 times greater than the resonance frequency of the first order mode of vibration. Thus, during typical operation of the MEMS device 200 such undesirable spurious modes of vibration may be suppressed.

As described previously, the shapes of the accordion springs in FIGS. 1A-1D and 2A-2E are non-limiting examples. Accordion springs may assume different shapes. A further non-limiting example is shown in FIG. 2F, which is a top down view of a MEMS device 220. The MEMS device 220 includes a proof mass 222, a first accordion spring formed by segments 224a, 224b, 224c, and 224d coupling the proof mass 222 to an anchor point 226, and a second accordion spring formed by segments 228a, 228b, 228c, and 228d coupling the proof mass 222 to an anchor point 230. Couplers 232a and 232b couple the accordion springs together. Still other shapes of accordion springs may be implemented in MEMS devices which include couplers coupling two or more accordion springs together.

Figure 3:
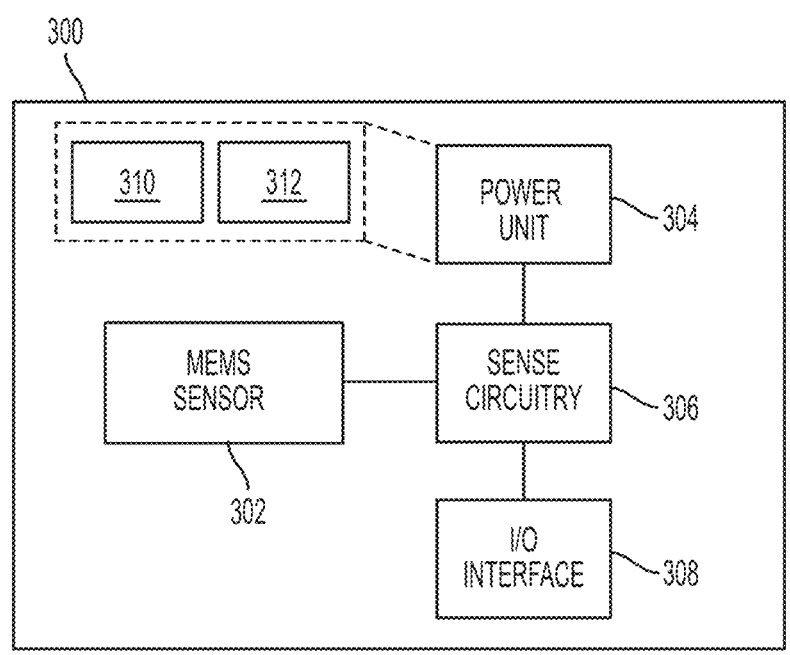
FIG. 3 is a system incorporating a MEMS inertial device of the types described herein.

MEMS devices of the types described herein may be used in various systems, such as energy harvesting systems, sensor systems, tunable capacitor systems, and control systems, among others. FIG. 3 is a system incorporating a MEMS inertial device of the types described herein. The system 300 is a sensor system including a MEMS sensor 302, a power unit 304, sense circuitry 306, and an input/output (I/O) interface 308. The MEMS sensor 302 may be a MEMS accelerometer, pressure sensor, gyroscope, or other type of sensor to sense a characteristic of interest. The power unit 304 may include an energy harvesting device 310, for example the MEMS devices 100 or 200 previously described herein and operated as energy harvesting devices, and an energy storage device 312. The energy storage device may be a battery, supercapacitor, or other suitable structure for storing energy harvested by the energy harvesting device 310. The harvested energy may be used to power sense circuitry 306 which controls operation of the MEMS sensor 302 and/or processes signals output by the MEMS sensor 302. The I/O interface 308 may be a wired or wireless interface for communicating with an external component, such as a computer, server, or other system.

Systems incorporating MEMS devices of the types described herein may be implemented in various settings. As an example, such systems may be used in industrial settings. For example, industrial machinery may generate vibration which creates energy that can be harvested by the MEMS devices described herein. The harvested energy may be used to power a sensor monitoring performance of the industrial machinery and/or a processor controlling operation of the machinery.

Figure 4:
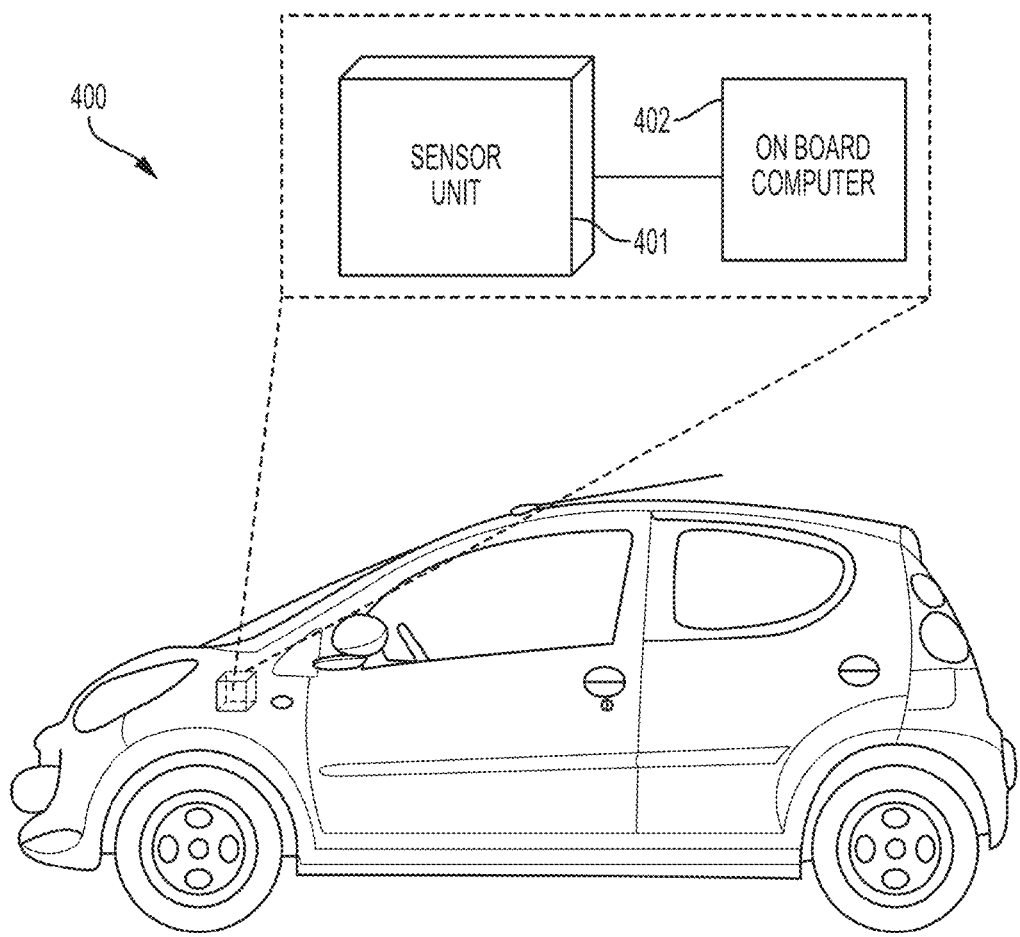
FIG. 4 illustrates an automobile having a sensor system of the type shown in FIG. 3, according to a non-limiting embodiment of the present application.

As an alternative, systems like that shown in FIG. 3 may be implemented in vehicles, such as automobiles, boats, or aircraft. FIG. 4 illustrates an example, in which a car 400 includes sensor unit 401 and onboard computer 402. The sensor unit 401 may be, for example, a system like that shown in FIG. 3, including a MEMS sensor, a power unit with an energy harvester of the types described herein, sensor circuitry, and interface circuitry. The sensor unit 401 may comprise a package or housing attached to a suitable part of the automobile 400. The sensor unit may, as an example, sense accelerations along the driving direction and/or perpendicular to the driving direction. Additionally, or alternatively, the sensor unit 401 may be configured to sense vertical accelerations, thus monitoring, for example, the status of the suspension. The energy harvester of the sensor unit 401 may collect energy from motion of the car. Sensor unit 401 may communicate with onboard computer 402, and may supply sense signals to the onboard computer.

MEMS devices according to aspects of the present application may be subjected to self-testing, in at least some embodiments. For example, MEMS energy harvesters having coupled accordion springs of the types described herein may be self-tested by applying a suitable drive signal, and the resulting motion of the proof mass may be evaluated. Self-testing of other types of MEMS devices having coupled accordion springs, and not just energy harvesters, may also be performed.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A microelectromechanical systems (MEMS) device, comprising:
   a substrate;
   a proof mass movably coupled to the substrate by first and second accordion springs, wherein the proof mass is disposed between the first and second accordion springs along a direction of compression of at least one of the first accordion spring or the second accordion spring; and
   a bar coupling an intermediate portion of a fold of the first accordion spring with an intermediate portion of a fold of the second accordion spring, the bar being movable relative to the proof mass along the direction of compression and being movable relative to the substrate along the direction of compression.

2. The MEMS device of claim 1, wherein each of the first and second accordion springs comprises a plurality of folds, wherein the bar is a first bar, the fold of the first accordion spring is a first fold of the first accordion spring, the fold of the second accordion spring is a first fold of the second accordion spring, and wherein the MEMS device further comprises a second bar coupling an intermediate portion of a second fold of the first accordion spring with an intermediate portion of a second fold of the second accordion spring, the second bar being movable relative to the proof mass.

3. The MEMS device of claim 2, wherein the first fold of the first accordion spring faces an opposite direction of the second fold of the first accordion spring.

4. The MEMS device of claim 3, wherein the first bar wraps around at least part of the first accordion spring.

5. The MEMS device of claim 1, wherein the bar has a length from the first accordion spring to the second accordion spring and a width perpendicular to the length, and wherein the width of the bar is between two and ten times greater than a width of the first accordion spring.

6. The MEMS device of claim 1, further comprising a third accordion spring and fourth accordion spring coupling the proof mass to the substrate and positioned such that the proof mass is between the third and fourth accordion springs, wherein the bar coupling the intermediate portion of the fold of the first accordion spring with the intermediate portion of the fold of the second accordion spring is a first bar, and wherein the MEMS device further comprises a second bar coupling an intermediate portion of a fold of the third accordion spring with an intermediate portion of a fold of the fourth accordion spring, the second bar being movable relative to the proof mass along the direction of compression and being movable relative to the substrate along the direction of compression.

7. The MEMS device of claim 1, wherein the proof mass and the bar each have a width in a direction substantially perpendicular to the direction of compression of at least one of the first accordion spring or the second accordion spring, and wherein the width of the bar is less than 10% the width of the proof mass.

8. The MEMS device of claim 1, wherein the bar wraps around at least part of the first accordion spring.

9. A microelectromechanical systems (MEMS) device, comprising:
   a substrate;
   a proof mass movably coupled to the substrate by first and second accordion springs, wherein the proof mass is disposed between the first and second accordion springs along a direction of compression of at least one of the first accordion spring or the second accordion spring; and
   means for coupling the first accordion spring with the second accordion spring.

10. The MEMS device of claim 9, wherein the means for coupling the first accordion spring with the second accordion spring comprises means for coupling multiple folds of the first accordion spring with multiple folds of the second accordion spring.

11. The MEMS device of claim 10, wherein the multiple folds of the first accordion spring include a first fold and a second fold facing in opposite directions of each other.

12. The MEMS device of claim 9, wherein the means for coupling the first accordion spring with the second accordion spring comprises means for creating a resonance frequency separation of a first mode of the proof mass from a second mode of the proof mass wherein the second mode has a resonance frequency between 2 and 20 times greater than that of the first mode.

13. The MEMS device of claim 9, further comprising a third accordion spring and fourth accordion spring coupling the proof mass to the substrate and positioned such that the proof mass is between the third and fourth accordion springs, and further comprising means for coupling the third accordion spring with the fourth accordion spring.

14. A system configured to harvest energy, comprising:
    an energy storage device; and
    an energy harvester coupled to the energy storage device and configured to deliver power to the energy storage device, the energy harvester comprising:
    a substrate;
    a proof mass movably coupled to the substrate by first and second accordion springs, wherein the proof mass is disposed between the first and second accordion springs along a direction of compression of at least one of the first accordion spring or the second accordion spring; and
    a bar coupling an intermediate portion of a fold of the first accordion spring with an intermediate portion of a fold of the second accordion spring, the bar being movable relative to the proof mass along the direction of compression and being movable relative to the substrate along the direction of compression.

15. The system of claim 14, further comprising a sensor or actuator coupled to the energy harvester and configured to receive power from the energy harvester.

16. The system of claim 15, wherein the sensor or actuator is a microelectromechanical systems (MEMS) sensor comprising:

a substrate;

a proof mass movably coupled to the substrate by third and fourth accordion springs, wherein the proof mass is disposed between the third and fourth accordion springs along a direction of compression of at least one of the third accordion spring or the fourth accordion spring; and a bar coupling an intermediate portion of a fold of the third accordion spring with an intermediate portion of a fold of the fourth accordion spring, the bar being movable relative to the proof mass along the direction of compression and being movable relative to the substrate along the direction of compression.

17. The system of claim 14, wherein each of the first and second accordion springs comprises a plurality of folds, wherein the bar is a first bar, the fold of the first accordion spring is a first fold of the first accordion spring, the fold of the second accordion spring is a first fold of the second accordion spring, and wherein the energy harvester further comprises a second bar coupling an intermediate portion of a second fold of the first accordion spring with an intermediate portion of a second fold of the second accordion spring, the second bar being movable relative to the proof mass.

18. The system of claim 17, wherein the first fold of the first accordion spring faces an opposite direction of the second fold of the first accordion spring.

19. The system of claim 14, wherein the energy harvester further comprises a third accordion spring and fourth accordion spring coupling the proof mass to the substrate and positioned such that the proof mass is between the third and fourth accordion springs, wherein the bar coupling the intermediate portion of the fold of the first accordion spring with the intermediate portion of the fold of the second accordion spring is a first bar, and wherein the energy harvester further comprises a second bar coupling an intermediate portion of a fold of the third accordion spring with an intermediate portion of a fold of the fourth accordion spring, the second bar being movable relative to the proof mass along the direction of compression and being movable relative to the substrate along the direction of compression.

20. The system of claim 14, wherein the bar wraps around at least part of the first accordion spring.

* * * * *